Figure 1:
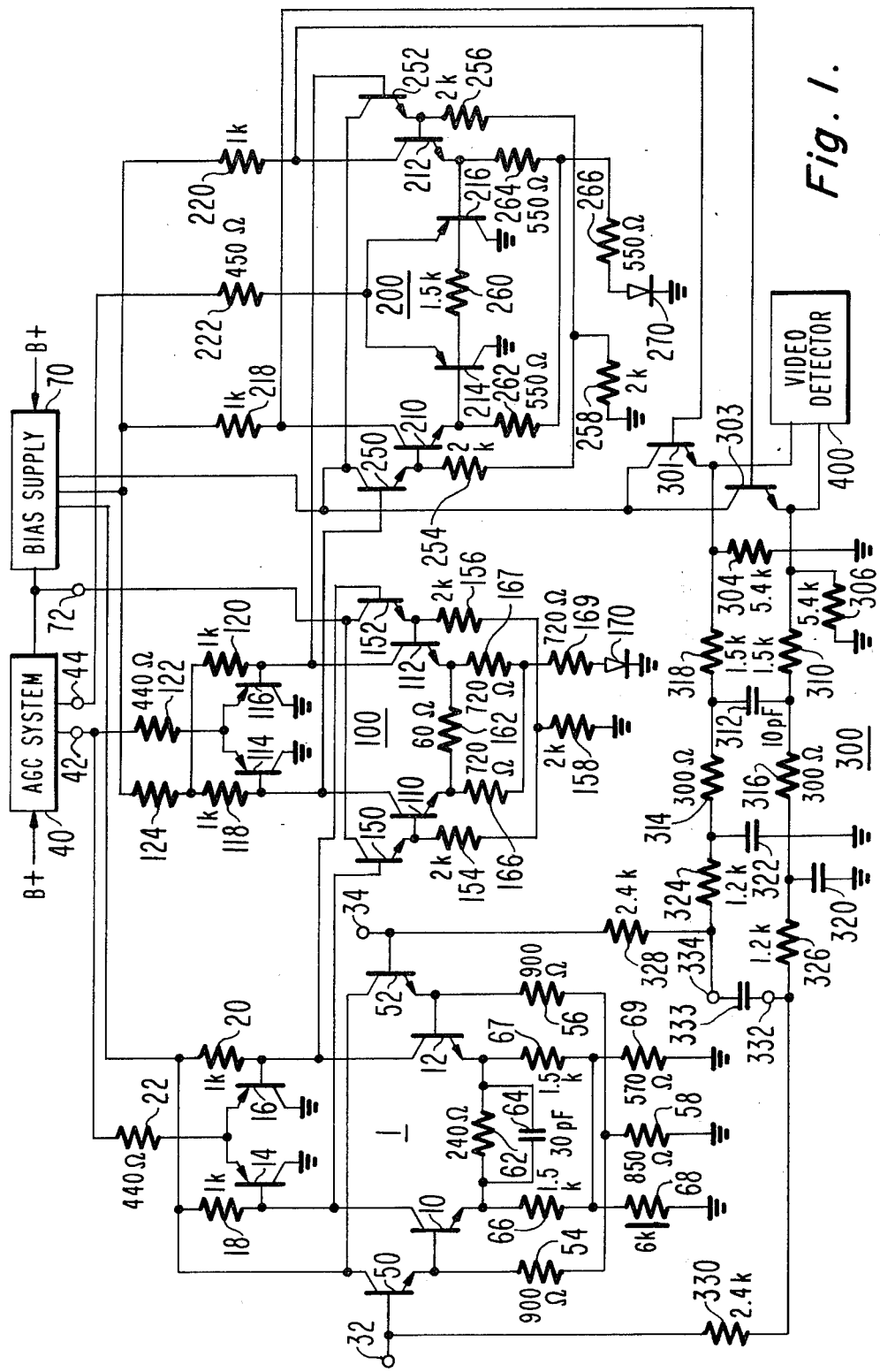

United States Patent [19]

Harford

[11] 4,329,713
[45] May 11, 1982

[54] TELEVISION AUTOMATIC GAIN CONTROL SYSTEM

[75] Inventor: Jack R. Harford, Flemington, N.J.

[73] Assignee: RCA Corporation, New York, N.Y.

[21] Appl. No.: 163,146

[22] Filed: Jun. 26, 1980

[51] Int. Cl.³ .............................................. H04N 5/52
[52] U.S. Cl. .................................................. 358/174
[58] Field of Search ................................. 358/174, 175

[56] References Cited

U.S. PATENT DOCUMENTS 3,673,498  6/1972  Harford ............................. 358/174
4,115,812  9/1978  Akatsu .............................. 358/174

*Primary Examiner*—Richard Murray

*Attorney, Agent, or Firm*—Paul J. Rasmussen; William H. Meagher; W. Brinton Yorks, Jr.

[57] ABSTRACT

An AGC system is provided which develops controllably delayed gain control signals of opposite sense for an intermediate frequency amplifier arrangement. One gain control current is applied to the collector of an output transistor. The collector of the transistor is coupled to its base by a network which includes a filter for removing signal frequency noise from the gain control signal developed at the emitter of the transistor. The filter also provides a controllable means for adjusting the tuner AGC delay point. Both gain control signals are supplied at low impedance transistor electrodes so that the opposite sense signals require no further amplification before being applied to the I.F. amplifiers.

4 Claims, 2 Drawing Figures

TELEVISION AUTOMATIC GAIN CONTROL SYSTEM

This invention relates to television automatic gain control (AGC) systems and, in particular, to an AGC system which provides noise filtered gain control signals of complementary polarities.

Intermediate frequency amplifiers in television receivers are conventionally gain controlled so that a substantially constant level I.F. signal is provided to the video detector. Certain I.F. amplifiers, such as those described in U.S. Pat. No. 3,641,450, or my copending United States patent application Ser. No. 163,143, entitled "TELEVISION INTERMEDIATE FREQUENCY AMPLIFIER", concurrently filed herewith, require gain control signals which vary in an opposite sense for the same sense of gain control (i.e., increasing or decreasing gain). This is due to the use of differing gain control techniques in different stages of the I.F. amplifier. For instance, the first two amplifier stages of the system described in my aforementioned patent application require increasing gain control current to reduce the gain of those stages. The third amplifier stage requires decreasing gain control current to reduce its gain. In accordance with the principles of the present invention, an AGC system is provided which develops controllably delayed gain control signals of opposite sense for an I.F. amplifier configuration such as those described in the above-mentioned patent and application.

It is desirable for an AGC system to introduce as little noise as possible into the I.F. amplifier system which it is controlling. If the AGC system introduces noise components of video frequencies into the amplifiers, this noise will be amplified and supplied to the video detector, where it will be detected along with the desired video information. Noise contamination in the I.F. amplifier is especially significant when the amplifiers are operated in a low gain (strong signal) condition, at which time the noise performance of the I.F. amplifier dominates the tuner noise performance and effectively determines the signal-to-noise performance in the tuner and I.F. section of the television receiver. It is desirable, then, to eliminate as many noise generators as possible from the I.F. system when operating under low I.F. gain conditions.

In certain prior art I.F. amplifier and AGC systems, such as that used in the TDA2540 I.F. IC, gain control signals are developed at various points on a voltage divider. Three gain control signals are then supplied to the three I.F. amplifiers used in the system. Since noise performance is most critical in the first stage (because noise in that stage will be subsequently amplified by the two following stages), the takeoff point for the gain control signal for the first stage is bypassed by a capacitor. However, the signal at the takeoff point is a relatively low level signal, and must then be amplified before it is applied to the first I.F. amplifier. The AGC amplifying transistor which performs this function has resistive components associated with it, which act as noise generators in the system. The noise developed by one of these resistors is amplified by the AGC amplifying transistor, is combined with noise components developed by a further resistor, and is then injected into the first I.F. amplifier. Similar noise generators are also present in the second and third I.F. amplifiers of the TDA2540 system. It is therefore desirable, in an I.F. system such as the TDA2540, to eliminate such noise generating resistive components, as well as amplifying devices which serve to amplify noise in the AGC system.

In accordance with a further aspect of the present invention, the AGC system provides a high level, noise filtered control signal for the first I.F. amplifier of a cascaded series of I.F. amplifiers. The high level control signal is provided from a low impedance point, and requires no further amplification before being applied to the first I.F. amplifier. In a preferred embodiment of the present invention, only a small value resistor is included in the signal path between the low impedance point and the first I.F. amplifier, which introduces only an insignificant amount of noise into the amplifier.

Figure 2:
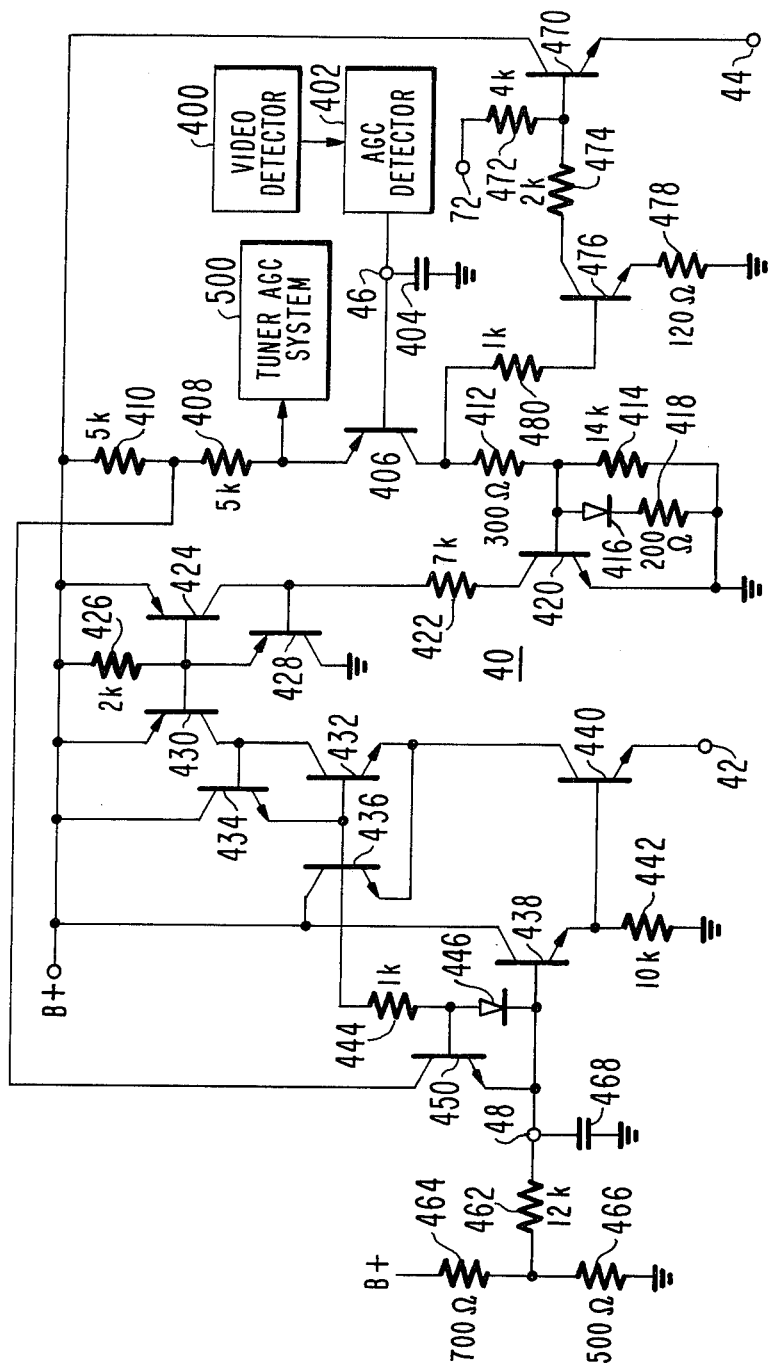

In the drawings:

FIG. 1 illustrates in schematic and block diagram form a three stage I.F. amplifier suitable for use with the AGC system of the present invention; and FIG. 2 illustrates in schematic and block diagram form an AGC system constructed in accordance with the principles of the present invention.

Referring to FIG. 1, three differential I.F. amplifier stages 1, 100 and 200 are coupled in cascade, with a feedback path 300 coupled between the third and first stages 200 and 1. The three stages are gain controlled by control currents supplied by an AGC system 40, and bias voltages for the system are provided by a bias supply 70.

Operation of the I.F. amplifier system of FIG. 1 is described in detail in my aforementioned U.S. patent application Ser. No. 163,143. Briefly, the first and second stages 1 and 100 each includes variable impedance devices 14, 16 and 114, 116, respectively, the impedances of which are varied to control the gains of the stages. The variable impedance devices are coupled as collector loads for respective amplifying transistors 10, 12 and 110, 112. In a high gain condition, the AGC system 40 provides no gain control current to the variable impedance devices. The gain of the amplifiers is reduced by applying gain control current to the variable impedance devices by way of a terminal 42 and resistors 22 and 122, which resistors provide equal gain control current sharing. As the gain control current flow is increased, the impedances of the collector load-coupled devices decrease, thereby shifting the load lines of the amplifier stages to a lower gain condition.

In the third amplifier stage 200, variable impedance devices 214 and 216 are coupled as emitter resistances to control the emitter degeneration of the amplifying transistors 210 and 212. Under maximum gain conditions, a significant amount of current is supplied to the devices by the AGC system 40 by way of terminal 44 and resistor 222. The gain of the amplifier is reduced by decreasing the gain control current supplied to the variable impedance devices, which increases their impedances and hence the emitter degeneration in the third stage amplifier. As explained in my aforementioned application, in the preferred embodiment of the arrangement of FIG. 1, the third amplifier stage is gain reduced first in response to increasing I.F. signal strength, so that the current flow to the third stage variable impedance devices 214 and 216 reaches zero, thereby cutting off the devices, before the first and second amplifier stages have traversed their full range of gain reduction. This prevents the introduction of intermodulation distortion into the amplified I.F. signal during strong signal (minimum gain) operation, which distortion could otherwise result from gain controlling the third stage during strong signal conditions.

The AGC system 40 of FIG. 1 is shown in greater detail in FIG. 2. A video detector 400 develops a detected video signal, which is applied to an AGC detector 402. The AGC detector 402 produces an output voltage at a terminal 46 which varies with I.F. signal strength. The AGC output voltage is stored on an AGC filter capacitor 404, which is coupled between terminal 46 and a point of reference potential (ground). The output voltage across capacitor 46 will typically vary from a high level for weak I.F. signals to a low level for strong I.F. signals. A typical range for the AGC output voltage in an embodiment of FIG. 2 is five to eleven volts.

Terminal 46 is coupled to the base of a transistor 406. The emitter of transistor 406 is coupled to the input of a tuner AGC system 500, and is coupled to a source of supply potential (B+) by serially connected resistors 408 and 410. The collector of transistor 406 is coupled to ground by serially connected resistors 412 and 414. As the AGC output voltage at terminal 46 decreases in response to the increasing I.F. signal level, transistor 406 becomes increasingly conductive, and the current through the serially coupled resistors increases.

The series combination of a forward biased diode 416 and a resistor 418 is coupled in parallel with resistor 414. The junction of resistors 412 and 414 and the anode of diode 416 is also coupled to the base of a transistor 420. The emitter of transistor 420 is coupled to ground, and its collector is coupled to the base of a transistor 428 and the collector of a transistor 424 by a resistor 422. The collector of transistor 428 is coupled to ground, and its emitter is directly coupled to the base of transistor 424, and the base of a transistor 430, and is coupled to the B+ supply by a resistor 426. The emitters of transistors 424 and 430 are coupled to the B+ supply. Transistors 424, 428 and 430 are coupled in a current mirror configuration.

The collector of transistor 430 is coupled to the base of a transistor 434 and the collector of a transistor 432. The collector of transistor 434 is coupled to the B+ supply, and its emitter is coupled to the base of transistor 432, the base of a transistor 436, and by way of a resistor 444 to the base of a transistor 450 and the anode of a diode 446. The collector of transistor 436 is coupled to the B+ supply, and its emitter is coupled to the emitter of transistor 432 and to the collector of a transistor 440. Transistors 434, 432 and 436 are therefore coupled in a current mirror configuration.

A terminal 48 is coupled to the emitter of transistor 450, the cathode of diode 446, and the base of a transistor 438. The collector of transistor 438 is coupled to the B+ supply, and its emitter is coupled to ground by a resistor 442 and to the base of transistor 440. The collector of transistor 450 is coupled to the junction of resistors 408 and 410. A capacitor 468 is coupled between terminal 48 and ground. A voltage divider including serially coupled resistors 464 and 466 is coupled between the B+ supply and ground. A resistor 462 is coupled between terminal 48 and the junction of resistors 464 and 466. The emitter of transistor 440 is coupled to a terminal 42, from which gain control current is supplied to the first and second I.F. amplifier stages 1 and 100 in FIG. 1.

A gain control signal for the third I.F. amplifier stage 200 of FIG. 1 is developed at the collector of transistor 406 in FIG. 2. The collector of transistor 406 is coupled to the base of a transistor 476 by a resistor 480. The emitter of transistor 476 is coupled to ground by a resistor 478, and its collector is coupled to the base of a transistor 470 by a resistor 474. A resistor 472 is coupled between a terminal 72 of the bias supply 70 (shown in FIG. 1) and the base of transistor 470. The collector of transistor 470 is coupled to the B+ supply, and its emitter provides gain control current to the third stage 200 by way of a terminal 44, as shown in FIG. 1.

For purposes of explanation of the arrangement of FIG. 2, it will be assumed that the AGC detector is responding to an I.F. signal which is increasing from a weak signal level to a strong signal level. The operation of the embodiment of FIG. 2 may be understood from the explanation of the response of the circuit to this increasing I.F. signal.

As the video signal level increases, the AGC output voltage at terminal 46 will decrease, and transistor 406 will become increasingly conductive. The current flow in the serially coupled resistors 410, 408 and 412, 414 will increase, and diode 416 will be turned on. Resistor 418 provides shaping of the AGC response curves, so that the AGC system will respond rapidly once diode 416 is turned on, and with increasing speed as diode 416 becomes increasingly conductive. The current conducted by diode 416 and resistor 418 will cause transistor 420 to become increasingly conductive, providing current to the current mirror which includes transistors 424, 428 and 430. Resistor 422, which is coupled in the current path to the current mirror, is a stopping resistor which limits the maximum amount of current which can be conducted by transistor 420 and the current mirror.

The current conducted to the current mirror transistors 424 and 428 by resistor 422 is replicated by the current mirror as the collector current of transistor 430. The current mirror does not use current limiting resistors in the emitter paths of transistors 424 and 430 because of the need for a wide dynamic range for the AGC current conducted by the mirror. The use of emitter resistors would cause the voltage range of the current mirror to be limited at the upper end, causing a corresponding limitation in the dynamic current range of the mirror. By deleting emitter resistors and using the stopping resistor 422 to prevent excessive current conduction by the current mirror, the current mirror is able to track the incoming current signal over its full dynamic range.

PNP transistors are used for current mirror transistors 424, 428 and 430 in the illustrative embodiment of FIG. 2. When the AGC system of FIG. 2 is constructed in integrated circuit form, the current handling capability of the current mirror is governed by the size of the PNP devices. If these transistors were to have the same current handling capability as the NPN transistors in the system, they would necessarily have to be much larger than the NPN transistors, and occupy larger areas on the integrated circuit chip. Accordingly, in a preferred embodiment of the AGC circuit of FIG. 2, PNP transistors 424, 428 and 430 are constructed as small, relatively low current devices, and are operated in the optimum ranges of the device characteristics.

The low level current at the collector of transistor 430 is amplified by a second current mirror, including transistors 432, 434, 436. In the illustrative embodiment of FIG. 2, these transistors are seen to be NPN type transistors which, on an integrated circuit, have higher current handling capabilities than PNP transistors of equivalent size. In addition, the emitter area of transistor 436 is three times that of transistor 432, causing transistor 436 to conduct three times the current of transistor 432 for the same base drive signal. This means, for example, that transistor 430 could be conducting one milliampere of current, which would substantially result in a one milliampere emitter current in transistor 432. However, transistor 436 would be conducting three times that current, or three milliamperes of emitter current. By connecting the two emitters together, a total of four milliamperes of current could be conducted to transistor 440 under these conditions.

The second current mirror is also coupled to the base of a transistor 450 by resistor 444. A known voltage level is established at the base of that transistor by virtue of the interconnection of diode 446, transistors 438 and 440, and the components of the first and second I.F. amplifiers coupled to terminal 42. The D.C. biasing of transistor 450 may be selected by choosing appropriate values for voltage divider resistors 462, 464 and 466 to determine the current conducted by resistor 444 to the base of the transistor. By determining the collector-to-emitter conductivity of transistor 450 in this manner, the delayed voltage at which tuner AGC control will commence may be determined. The collector of transistor 450 is coupled to the junction of resistors 408 and 410. If transistor 450 is D.C. biased to conduct a greater amount of current, for instance, it will cause an increased voltage drop across resistor 410. This will cause the voltage at the emitter of transistor 406 and the input to the tuner AGC system 500 to initially be lower than would otherwise be the case, thereby advancing the time at which tuner AGC control will commence in the gain reduction process. Likewise, if transistor 450 is biased for decreased conduction, the voltage drop across resistor 410 will be less. The voltage level at the input to the tuner AGC system 500 will then initially be higher, which will delay the time at which tuner AGC control begins. When the AGC system of FIG. 2 is constructed in integrated circuit form, terminal 48 may comprise an I.C. terminal, which permits resistors 462, 464 and 466 to be selected by the system user and coupled externally to the I.C.

In a preferred embodiment of the arrangement of FIGS. 1 and 2, the I.F. amplifiers will continue to be gain reduced while tuner gain reduction occurs. However, the tuner AGC system 500 is designed to traverse its full range of gain reduction over a small change in the emitter voltage of transistor 406. The tuner will be fully gain reduced at a relatively rapid rate as compared with the I.F. amplifier.

Typically, the I.F. amplifiers will be gain reduced by only about four db as the tuner traverses its full gain reduction range.

The current provided by the emitters of transistors 432 and 436 is the regulated flow of gain control current for the first and second amplifier stages 1 and 100 of FIG. 1. This gain control current may be contaminated with baseband video signal frequency noise, which will propagate through the I.F. system and appear in the detected baseband signal. However, noise components are removed from the gain control signal just prior to terminal 42, at which point the gain control signal is applied to the I.F. amplifiers.

The gain control current from transistors 432 and 436 is applied to the collector of transistor 440. The collector of transistor 440 is coupled to its base by the path which includes the second current mirror 432, 434 and 436, resistor 444, diode 446, and transistor 438. Transistor 440 is thus coupled to operate somewhat in the manner of a diode, insofar as whatever current is supplied to the collector of the transistor will appear as an emitter current flow. Because the second current mirror simultaneously supplies current to both the collector and the base of transistor 440, the second current mirror will provide base current to transistor 440 which is of a magnitude sufficient to cause the transistor to conduct whatever current the second current mirror is applying to the collector of the transistor.

A filter capacitor 468 is coupled to the base of transistor 440 by transistor 438. Transistor 438 is coupled in a low impedance emitter follower configuration, so that the capacitor 468 is effectively coupled directly to the base of transistor 440. In addition, transistor 438 provides an impedance transformation between the circuit elements coupled to terminal 48 and the base of transistor 440. This impedance transformation permits the use of an inexpensive capacitor at terminal 48 which has a relatively low component value.

The resistor 444, which is part of the collector-to-base coupling of transistor 440, also cooperates with capacitor 468 to form a low pass filter for noise filtering. The base drive signal of transistor 440 is thus filtered to remove video frequency noise components. Since the voltage at the emitter of transistor 440 will follow the voltage at the base of the transistor through emitter follower transistor operation, the gain control current supplied to terminal 42 will be filtered of video frequency noise.

The noise filtered gain control current signal is provided from the low impedance emitter electrode of transistor 440, obviating the need for subsequent amplification before the gain control current is applied to the I.F. amplifiers. It may be seen in the illustrative embodiment of FIG. 1 that terminal 42 is coupled to the first and second I.F. amplifiers by 440 ohm resistors 22 and 122, which provide substantially equal sharing of the gain control current by the first and second I.F. stages. Resistors 22 and 122 are of sufficiently low values that they contribute no significant noise to the I.F. amplifiers under low gain (strong signal) conditions, when noise performance of the I.F. amplifier is most critical.

The gain control current for the third I.F. stage 200 of FIG. 1 is provided by the current path including transistors 476 and 470 in FIG. 2, which are coupled to the collector of transistor 406. As transistor 406 becomes increasingly conductive in response to an increasing video signal level, transistor 476 turns on at a rate determined by biasing resistors 412, 418 and 478. As transistor 476 becomes increasingly conductive, it begins to turn off transistor 470. The gain control current supplied to the third I.F. amplifier 200 by transistor 470 through terminal 44 is then rapidly decreased, thereby reducing the gain of the third I.F. amplifier in response to the increasing video signal level.

It may be seen in the arrangement of FIG. 2 that there are several resistive elements between the collector of transistor 406 and terminal 44, which components can act as noise generators in the system. Furthermore, no noise filtering is performed on the gain control current which is developed at terminal 44. However, as stated previously, it is the low gain (strong I.F. signal) operating condition of the I.F. amplifiers during which noise performance is most critical. As discussed above, in a preferred embodiment of the present invention, the third I.F. stage 200 is gain reduced first, after which the first and second stages are gain reduced. This means that transistor 470 is turned off early in the gain reduction process to reduce the gain of the third I.F. stage. Thus, as the system approaches a low gain condition, transistor 470 is turned off, and will therefore introduce no noise into the third I.F. amplifier 200. Noise filtering at terminal 44 is thus unnecessary in an embodiment of the present invention.

What is claimed is:

1. In a television receiver, including an intermediate frequency amplifier which is responsive to a gain control current for variably amplifying an intermediate frequency signal; and a video detector which is responsive to said amplified intermediate frequency signal for producing a detected video signal; an automatic gain control system comprising:
   an AGC detector coupled to said video detector and responsive to said video signal for producing an output signal which is representative of the level of said amplified intermediate frequency signal;
   a voltage divider, coupled between a source of supply voltage and a point of reference potential, including an intermediate tap, and responsive to said output signal for developing a voltage at said intermediate tap which is a function of said output signal;
   a current mirror circuit, having an input coupled to said intermediate tap and responsive to the voltage thereat for developing a control signal, at a first output, and a gain control current at a second output;
   a filter circuit coupled between said first output of said current mirror and a point of reference potential;
   a transistor having a first electrode coupled to said second output of said current mirror for receiving said gain control current, a base electrode coupled to said filter circuit for receiving a filtered replica of said control signal, and a third electrode coupled to an output terminal, at which a filtered gain control current is produced; and
   means for applying said filtered gain control current to said intermediate frequency amplifier for controlling the gain thereof.

2. In a television receiver, including an intermediate frequency amplifier which is responsive to a gain control current for variably amplifying an intermediate frequency signal; and a video detector which is responsive to said variably amplified intermediate frequency signal for producing a detected video signal; an automatic gain control system comprising:
   an AGC detector having an input coupled to receive said detected video signal, and an output at which an output signal is produced having a signal level which is representative of the level of said amplified intermediate frequency signal;
   a translating circuit having an input coupled to the output of said AGC detector, a first output at which a control signal is produced, and a second output at which a gain control current is produced, said control signal and said gain control current being related to the level of said AGC detector output signal;
   a filter circuit coupled between said first output of said translating circuit and a point of reference potential;
   a transistor having a first electrode coupled to said second output of said translating circuit for receiving said gain control current, a base electrode coupled to said filter circuit for receiving a filtered replica of said control signal, and a third electrode coupled to an output terminal at which a filtered gain control current is produced; and
   means for applying said filtered gain control current to said intermediate frequency amplifier.

3. In a television receiver, including a tuner which develops an intermediate frequency signal; an intermediate frequency amplifier which is responsive to a gain control current for variably amplifying said intermediate frequency signal; and a video detector which is responsive to said variable amplified intermediate frequency signal for producing a detected video signal; an automatic gain control system comprising:
   an AGC detector having an input coupled to receive said detected video signal, and an output at which an output signal is produced having a signal level which is representative of the level of said amplified intermediate frequency signal;
   a voltage divider, coupled between a source of supply voltage and a point of reference potential, including first and second intermediate taps, and responsive to said output signal for developing voltages at said first and second intermediate taps which are a function of said output signal;
   a tuner AGC circuit, having an input coupled to said voltage divider, for supplying a gain control signal for said tuner;
   a signal translating circuit having an input coupled to said second intermediate tap for developing a gain control current in response to the voltage at said second intermediate tap;
   means for applying said gain control current to said intermediate frequency amplifier;
   a transistor having a first electrode coupled to said signal translating circuit, a second electrode coupled to a terminal, and a third electrode coupled to said first intermediate tap of said voltage divider; and
   a biasing circuit, coupled to said terminal for controlling the conductivity of said transistor,
   wherein the voltage at said first intermediate tap is also a function of the conductivity of said transistor.

4. In a television receiver, including a tuner which develops an intermediate frequency signal; an intermediate frequency amplifier which is responsive to a gain control current for variably amplifying said intermediate frequency signal; and a video detector which is responsive to said variably amplified intermediate frequency signal for producing a detected video signal; an automatic gain control system comprising:
   an AGC detector having an input coupled to receive said detected video signal, and an output at which an output signal is produced having a signal level which is representative of the level of said amplified intermediate frequency signal;
   a tuner AGC circuit, having an input coupled to said output of said AGC detector and responsive to the voltage level thereat for controllably supplying a gain control signal for said tuner;
   a signal translating circuit having an input coupled to the output of said AGC detector and an output at which a gain control current is produced which is a function of the level of said AGC detector output signal;
   a transistor having an input electrode coupled to the output of said signal translating circuit, a base electrode, and an output electrode coupled to said intermediate frequency amplifier for supplying said gain control current thereto;

means, including a resistor and a terminal, for coupling said output of said signal translating circuit to the base of said transistor and to the input of said tuner AGC circuit, said coupling means including a capacitor coupled to said terminal and cooperating with said resistor to form a filter for filtering the gain control current supplied to said intermediate frequency amplifier, said coupling means further including bias means coupled to said terminal for controlling the current conducted by said resistor, wherein the voltage level at the input of said tuner AGC circuit is a function of the current which is conducted by said resistor.

* * * * *